(12) United States Patent
Huang

(10) Patent No.: US 9,081,056 B2
(45) Date of Patent: Jul. 14, 2015

(54) METHOD FOR DETECTING WORKING STATE OF I/O PINS OF ELECTRONIC COMPONENTS USING CHARGES FROM HUMAN BODY

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Ren-Wen Huang, Shenzhen (CN)

(73) Assignees: Fu Tai Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 88 days.

(21) Appl. No.: 13/871,162

(22) Filed: Apr. 26, 2013

(65) Prior Publication Data
US 2013/0285689 A1    Oct. 31, 2013

(30) Foreign Application Priority Data
Apr. 27, 2012 (CN) .......................... 2012 1 0127242

(51) Int. Cl.
*G01R 31/20* (2006.01)
*G01R 19/00* (2006.01)
*G01R 31/28* (2006.01)
*G01R 31/317* (2006.01)

(52) U.S. Cl.
CPC ...... *G01R 31/2886* (2013.01); *G01R 31/31715* (2013.01)

(58) Field of Classification Search
CPC .............. G01R 31/002; G01R 31/001; G01R 29/0814; G01R 29/12; G01R 31/2884; G01R 13/28; G01R 31/2879; G01R 31/31715; G01R 31/2886; G01R 29/24; G01R 31/08; G01R 31/129; G01Q 20/04; G01N 29/2406; G01N 29/24; G01G 19/4142; H01G 9/08; H01G 9/155; H02N 1/08
See application file for complete search history.

(56) References Cited

U.S. PATENT DOCUMENTS

| | | | |
|---|---|---|---|
| 3,760,262 A * | 9/1973 | Chovanec et al. | 324/452 |
| 2007/0159186 A1* | 7/2007 | Grund | 324/678 |
| 2011/0241713 A1* | 10/2011 | Duarte De Martin et al. | 324/755.01 |

* cited by examiner

*Primary Examiner* — Vinh Nguyen
(74) *Attorney, Agent, or Firm* — Novak Druce Connolly Bove + Quigg LLP

(57) ABSTRACT

In a method for detecting working states of I/O pins of electronic components, a signal is transmitted between at least two of the I/O pins. A probe of an oscilloscope is connected to an I/O pin. A waveform of the signal through the I/O pin is detected. Charges are transmitted to the probe. A working state of the I/O pin is determined by detecting whether the waveform of the signal through the I/O pin is changed when the charges are transmitted to the probe.

6 Claims, 5 Drawing Sheets

METHOD FOR DETECTING WORKING STATE OF I/O PINS OF ELECTRONIC COMPONENTS USING CHARGES FROM HUMAN BODY

BACKGROUND

1. Technical Field

The present disclosure relates to testing technologies for electronic components, and more particularly, to a method for detecting working states of input/output (I/O) pins of electronic components.

2. Description of Related Art

A conventional electronic device, such as a computer, includes a circuit board having a plurality of electronic components such as resistors and chips (e.g., processors). When signals are transmitted among different components, the signals may malfunction or be inoperative due to faulty hardware or software. In order to find out the cause of the malfunction or inoperativeness of the signals, tests are performed on the circuit board. First, it is needed to detect the working states of I/O pins of the electronic components.

BRIEF DESCRIPTION OF THE DRAWINGS

The components in the drawings are not necessarily drawn to scale, the emphasis instead placed upon clearly illustrating the principles of at least one embodiment. In the drawings, like reference numerals designate corresponding parts throughout the various views, and all the views are schematic.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one".

Figure 1:
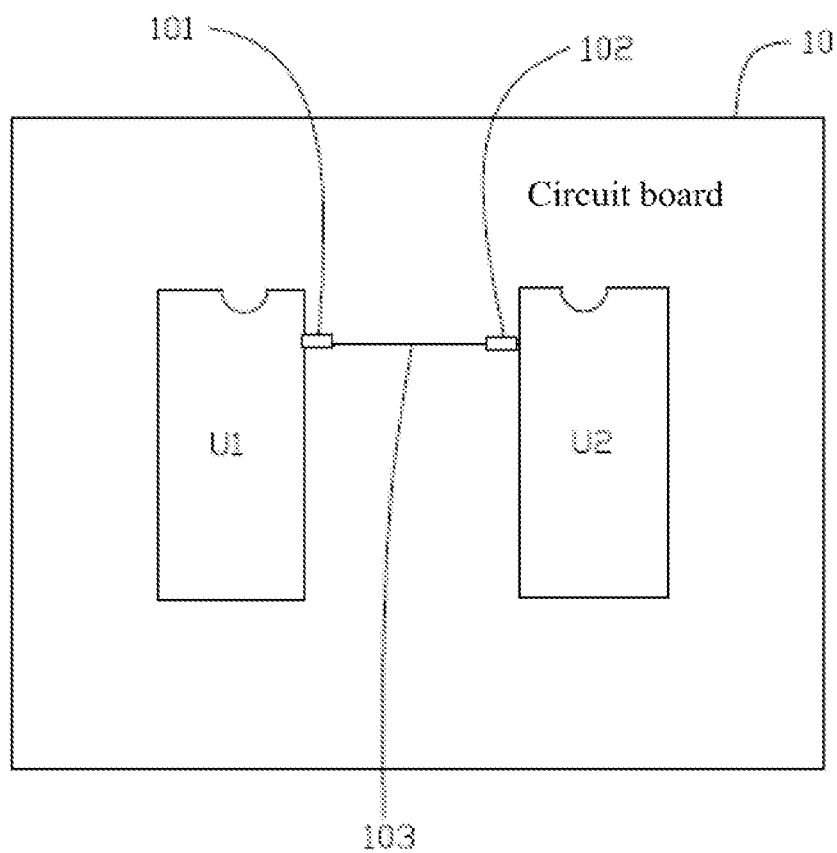
FIG. 1 is a schematic diagram of a circuit board of an electronic device according to an exemplary embodiment of the present disclosure.

FIG. 1 is a schematic diagram of a circuit board 10 of an electronic device (not shown). In the embodiment, the electronic device may be, for example, a computer. The circuit board 10 may include a first chip U1 and a second chip U2. Each of the first chip U1 and the second chip U2 includes at least one I/O pin, which respectively are a first I/O pin 101 and a second I/O pin 102. The first I/O pin 101 is electronically connected to the second I/O pin 102 through a signal wire 103 for signal transmission between the first chip U1 and the second chip U2. The signal wire 103 may be a conductive metal wire.

Both the first chip U1 and the second chip U2 have a software program to perform signal transmission therebetween. The first chip U1 and the second chip U2 may be integrated chips, such as processors.

Figure 2:
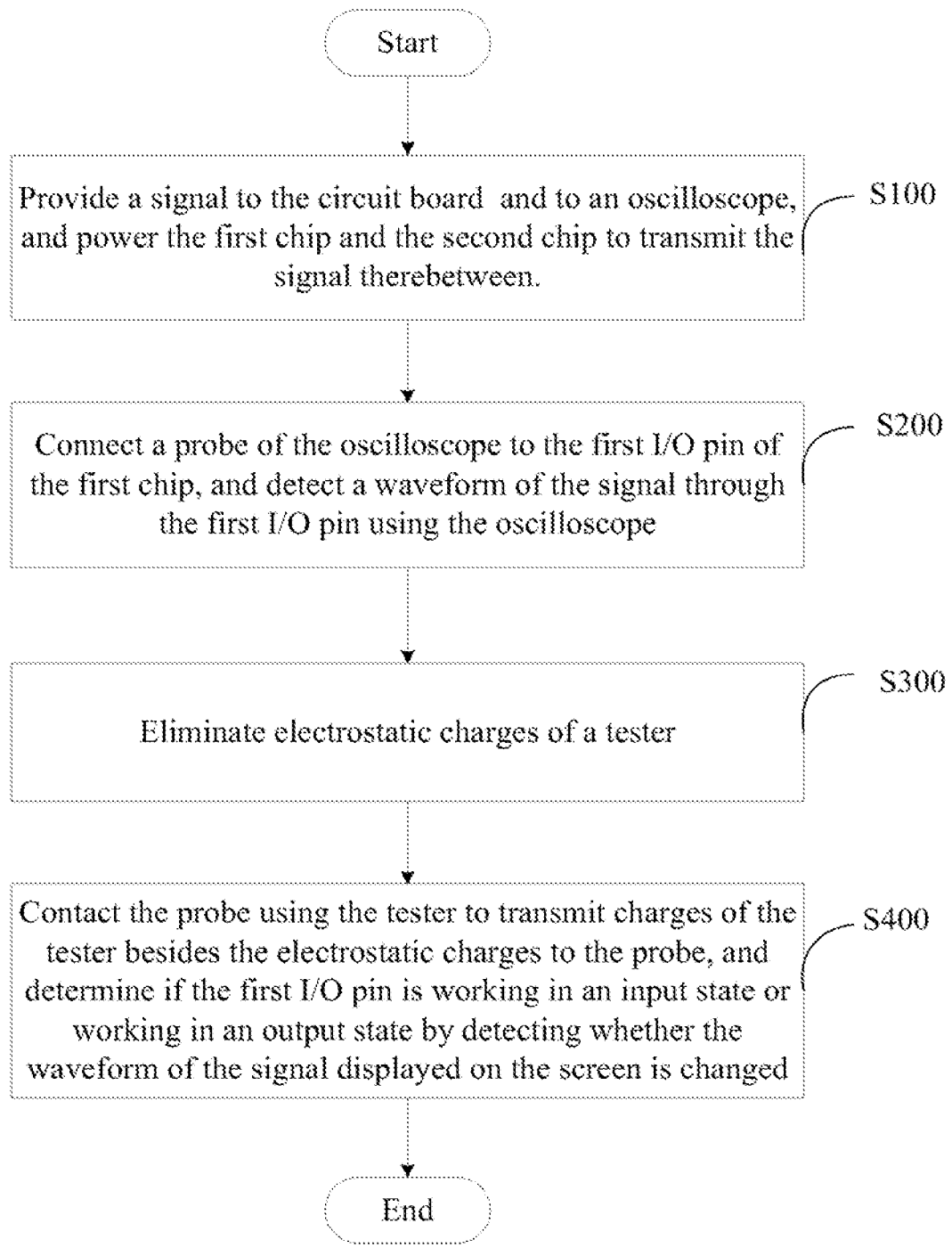
FIG. 2 is a flow chart of a method for detecting a working state of an I/O pin of FIG. 1.

FIG. 2 shows a flow chart of a method for detecting a working state of an I/O pin of FIG. 1. Depending on the embodiment, additional steps may be added, others removed, and the ordering of the steps may be changed.

In step S100, provide a signal to the circuit board 10 and to an oscilloscope 20 (see FIG. 3), and power the first chip U1 and the second chip U2 to transmit the signal therebetween.

In one embodiment, the signal may be generated by a signal generation apparatus (not shown) and then the signal may be manually provided to the circuit board 10. When the circuit board 10 receives the signal, the signal is transmitted between the first chip U1 and the second chip U2 under the control the first chip U1 and the second chip U2. The first chip U1 and the second chip U2 have a signal receiving pin (not shown) respectively, and the signal receiving pin is used to receive the signal generated by the generation apparatus. At this time, the first chip U1 and the second chip U2 communicate with each other and transmit the signal through the signal wire 103.

Figure 3:
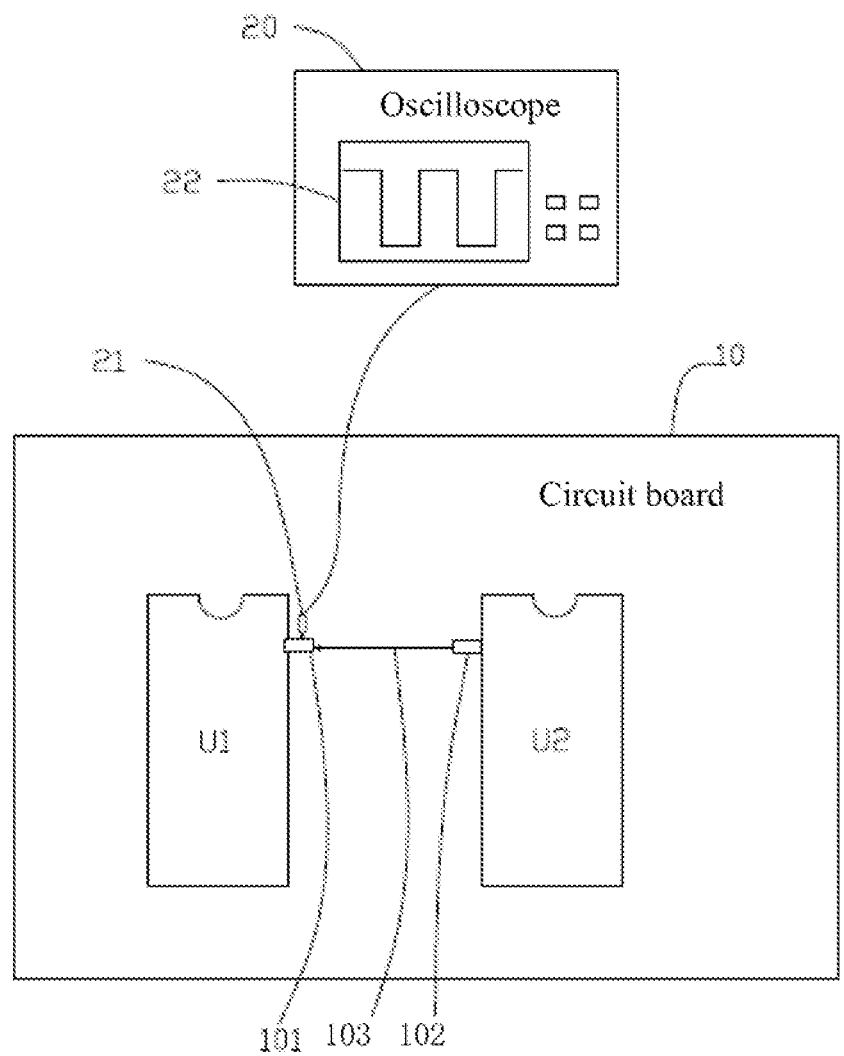
FIGS. 3-5 show a process of detecting the working state of the I/O pin using an oscilloscope.

In step S200, connect a probe 21 of the oscilloscope 20 to the first I/O pin 101 of the first chip U1, and detect a waveform of the signal through the first I/O pin 101 using the oscilloscope 20. The detected waveform is displayed on the oscilloscope 20. In one example, as shown in FIG. 3, the oscilloscope 20 includes the probe 21 and a screen 22. The probe 21 detects the signal through the first I/O pin 101 and transmits the detected signal to the oscilloscope 20. The screen 22 displays the waveform of the signal detected by the probe 21. The waveform may be, for example, sinusoidal, square, or rectangular.

In step S300, eliminate electrostatic charges of a tester. In an example, a conductive object is applied to the tester to eliminate any electrostatic charges on the tester.

In step S400, contact the probe 21 using the tester (e.g., a finger) to transmit charges of the tester besides the electrostatic charges to the probe 21, and determine if the first I/O pin 101 is working in an input state or working in an output state by detecting whether the waveform of the signal displayed on the screen 22 is changed.

In this embodiment, the tester is regarded as a conductive object. The charges transmitted to the probe 21 are the charges attached with the tester besides the eliminated electrostatic charges. Since the electrostatic charges are eliminated in the step S300, interferences of the electrostatic charges to the signal are avoided. When a pin (e.g., the first I/O pin 101 or the second I/O pin 102) is used as an input pin, a high impedance is connected to the input pin. However, when the pin is used as an output pin, a low impedance is connected to the output pin. Therefore, the charges transmitted to the input pin can not be easily transmitted to the ground through the high impedance, and the signal through the input pin is interfered. In contract, the charges transmitted to the output pin can be easily transmitted to the ground, and the interference of the charges to the output pin are almost not exist. As detailed above, whether the first I/O pin 101 is working in an input state or in an output state can be determined by detecting whether the waveform is changed when the charges are transmitted to the probe 21.

Figure 4:
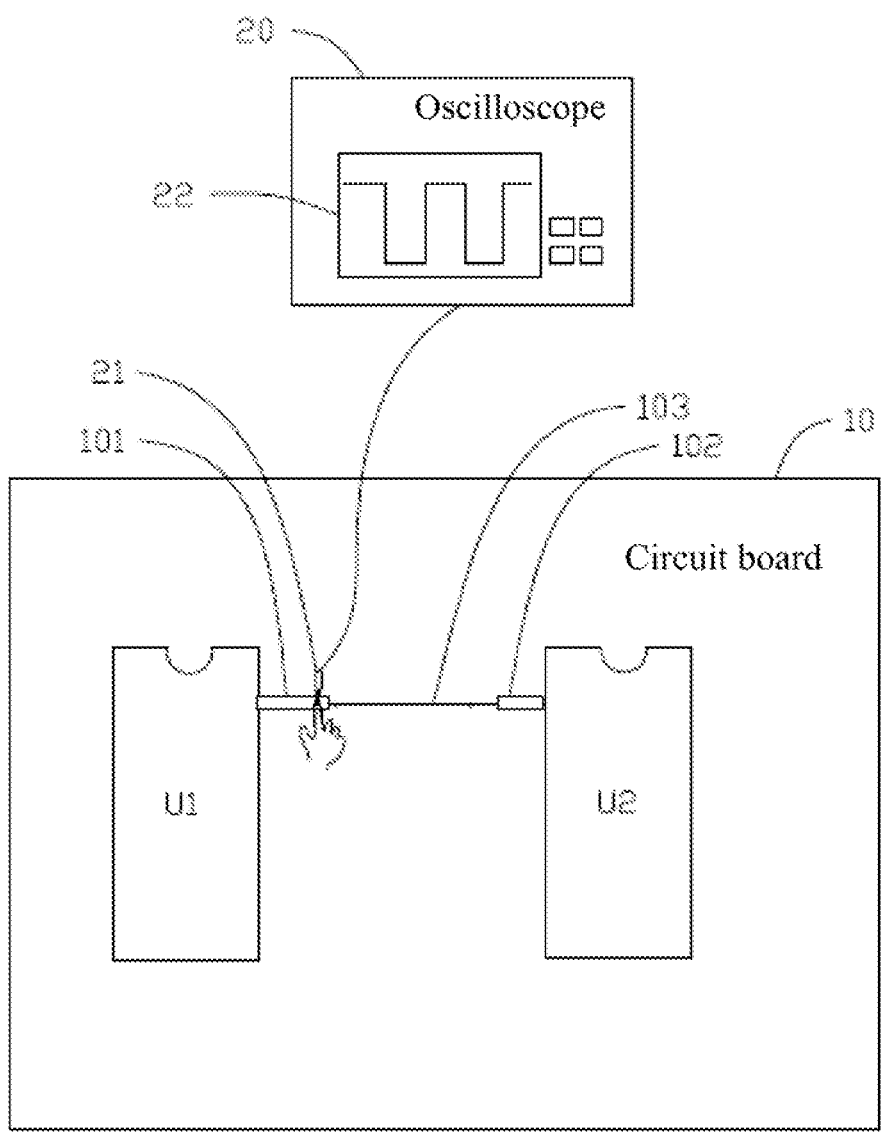
Figure 5:
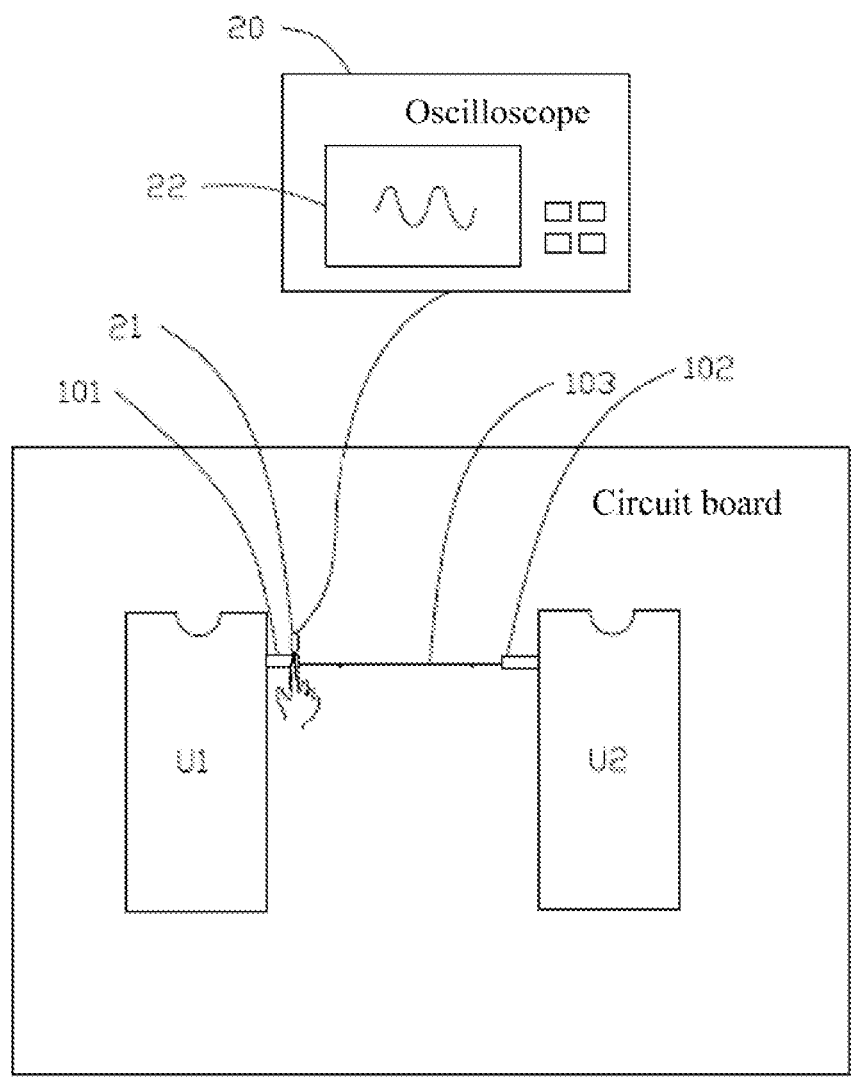

In the embodiment, when the waveform of the signal displayed on the screen 22 is changed by being influenced by charges, the first I/O pin 101 is working in an input state to receive the signal such as from other components (e.g., the second chip U2) of the circuit board 10. Otherwise, if the waveform is not changed by being influenced by charges, the first I/O pin 101 is working in an output state to output the signal to other components (e.g., the second chip U2) of the circuit board 10. In one example, as shown in FIG. 4, when a finger contacts the probe 21, the waveform is not changed as shown on the screen 22 of the oscilloscope 20 in FIG. 4, the first I/O pin 101 is working in an output state to output the signal. When the waveform is changed as shown in FIG. 5, the first I/O pin 101 is working in an input state to receive the signal.

It is understood that the method as mentioned in steps S100-S400 is also available for detecting if the second I/O pin 102 or other pins used for transmitting the signal is working in input state or working in output state. The second I/O pin 102 can be detected by using the method as described in the steps S100 to S400.

In another embodiment, the circuit board 10 may include only one chip, for example one of the first chip U1 or the second chip U2, and another of the first chip U1 and the second chip U2 may be replaced by other components, such as, resistors or capacitors.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A method for detecting working states of input/output(I/O) pins of electronic components, the method comprising:
   powering the electronic components, the electronic components sending or receiving signal between at least two of the I/O pins of different components;
   connecting a probe of an oscilloscope to an I/O pin of the electronic components;
   detecting a waveform of the signal passing through the I/O pin;
   transmitting charges of a human body or a portion of the human body to the probe of the oscilloscope, the charges being transmitted to the probe by the human body or a portion of the human body contacting the probe; and
   determining if the I/O pin is working in an input state or an output state by detecting whether the waveform of the signal is changed when the charges of the human body or a portion of the human body are transmitted to the probe.

2. The method according to claim 1, wherein the I/O pin is determined to be working in the input state to receive the signal, when the waveform is changed.

3. The method according to claim 1, wherein the I/O pin is determined to be working in the output state to output the signal, when the waveform is not changed.

4. The method according to claim 1, further comprising:
   displaying the detected waveform of the signal passing through the I/O pin on a screen of the oscilloscope.

5. The method according to claim 1, further comprising:
   eliminating electrostatic charges from charges of the human body by contacting a conductive object before the charges of the human body are transmitted to the probe.

6. The method according to claim 1, wherein the electronic components comprise at least one integrated chip.

* * * * *

UNITED STATES PATENT AND TRADEMARK OFFICE
CERTIFICATE OF CORRECTION

PATENT NO. : 9,081,056 B2  
APPLICATION NO. : 13/871162  
DATED : July 14, 2015  
INVENTOR(S) : Ren-Wen Huang Page 1 of 1

It is certified that error appears in the above-identified patent and that said Letters Patent is hereby corrected as shown below:

Title page, item (73) Assignees: should read as follows

-- (73) Assignees: Fu Tai Hua Industry (Shenzhen) Co., Ltd., Shenzhen (CN);
Hon Hai Precision Industry Co., Ltd., New Taipei (TW) --.

Signed and Sealed this
First Day of December, 2015

Michelle K. Lee
*Director of the United States Patent and Trademark Office*